United States Patent
Tan et al.

(10) Patent No.: US 7,071,069 B2
(45) Date of Patent: Jul. 4, 2006

(54) SHALLOW AMORPHIZING IMPLANT FOR GETTERING OF DEEP SECONDARY END OF RANGE DEFECTS

(75) Inventors: Chung Foong Tan, Singapore (SG); Hyeokjae Lee, Singapore (SG); Eng Fong Chor, Singapore (SG); Elgin Quek, Singapore (SG)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 102 days.

(21) Appl. No.: 10/743,247

(22) Filed: Dec. 22, 2003

(65) Prior Publication Data

US 2005/0136623 A1    Jun. 23, 2005

(51) Int. Cl.
*H01L 21/336* (2006.01)
(52) U.S. Cl. .................. 438/306; 438/289; 438/302
(58) Field of Classification Search .............. 438/247, 438/286, 289, 301, 302, 305, 306, 307, 407, 438/520, 527, 528
See application file for complete search history.

(56) References Cited

U.S. PATENT DOCUMENTS

| | | | |
|---|---|---|---|
| 5,675,166 A * | 10/1997 | Ilderem et al. ............. 257/345 |
| 5,937,293 A * | 8/1999 | Lee ............................ 438/247 |
| 6,268,640 B1 * | 7/2001 | Park et al. .................. 257/607 |
| 6,344,405 B1 * | 2/2002 | Saha .......................... 438/514 |
| 6,399,452 B1 * | 6/2002 | Krishnan et al. ........... 438/305 |
| 6,465,315 B1 * | 10/2002 | Yu ............................. 438/306 |
| 6,475,885 B1 | 11/2002 | Sultan |
| 6,537,886 B1 | 3/2003 | Lee |
| 6,630,385 B1 * | 10/2003 | Yu ............................. 438/289 |
| 6,846,708 B1 * | 1/2005 | Feudel et al. ............... 438/162 |
| 2002/0001926 A1 | 1/2002 | Noda |
| 2003/0013260 A1 | 1/2003 | Gossmann et al. |
| 2003/0049917 A1 | 3/2003 | Noda |
| 2003/0096490 A1 | 5/2003 | Borland et al. |

OTHER PUBLICATIONS

Noda, "Evolution of end-of-range damage and transient enhanced diffusion of indium in Silicon", Journal-of applied physics, vol. 91, #2 Jan. 15, 2002, pp. 639-645.

Yeh et al., Optimum halo structure for sub-0.1. m cMOSFETs, IEEE trans on electronic devices, vol. 48, # 10, Oct. 2001, pp. 2357-2362.

(Continued)

*Primary Examiner*—Zandra V. Smith
*Assistant Examiner*—Pamela E Perkins
(74) *Attorney, Agent, or Firm*—William J. Stoffel

(57) ABSTRACT

A pocket implant process to reduce defects. We provide a gate structure, on a semiconductor substrate doped with a first conductivity type dopant. We perform a pocket amorphizing implantation procedure to form a pocket implant region adjacent to the gate structure, and an amorphous pocket region. Next, we perform a shallow amorphizing implant to form an amorphous shallow implant region. The amorphous shallow implant region being formed at a second depth above the amorphous pocket region. The substrate above the amorphous shallow implant region preferably remains crystalline. We perform a S/D implant procedure to form Deep S/D regions. We perform an anneal procedure preferably comprised of a first soak step and a second spike step to recrystalilze the amorphous shallow implant region and the amorphous pocket region, The defects created by the pocket implant are reduced by the shallow amorphous implant.

24 Claims, 9 Drawing Sheets

OTHER PUBLICATIONS

Lisebarger, et al., "Study of end of range loop interactions with B[sup+] implant damage using a boron doped diffusion layer", J. Appl. Phys. 78 (4), Aug. 15, 1995, pp. 2298-2302.

Lu et al., "Reduction of secondary defect formation in MeV B+ ion-implanted Si(100)", Appl. pHys. Lett, 655 (18), Oct 30, 1989, pp. 1838-1840.

* cited by examiner

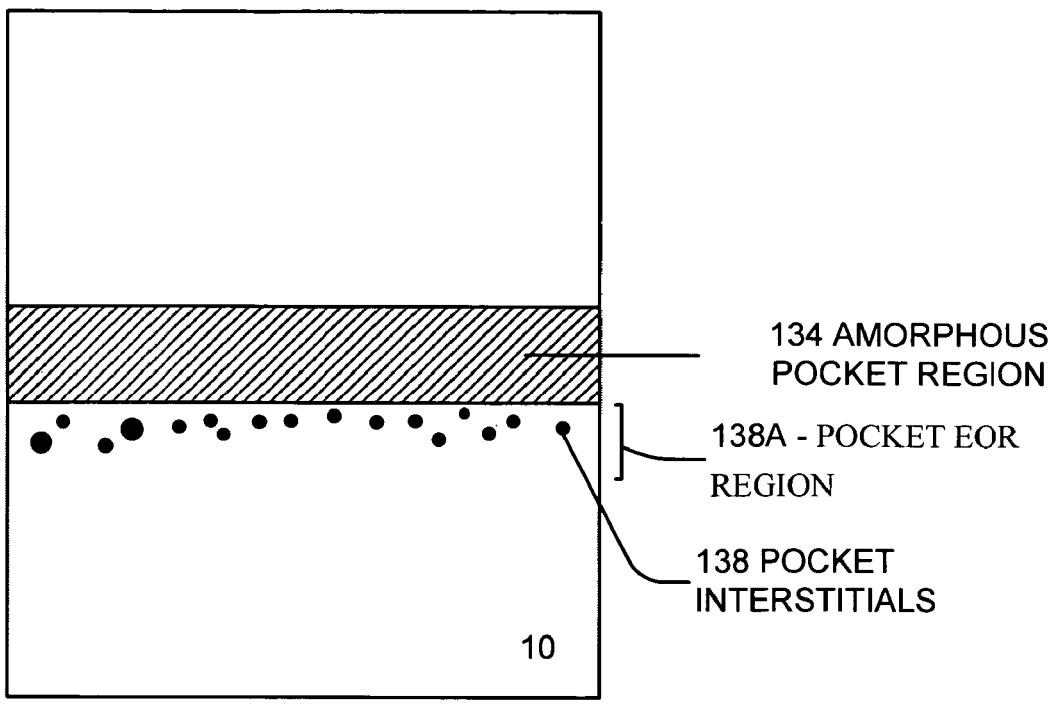
FIGURE 7A
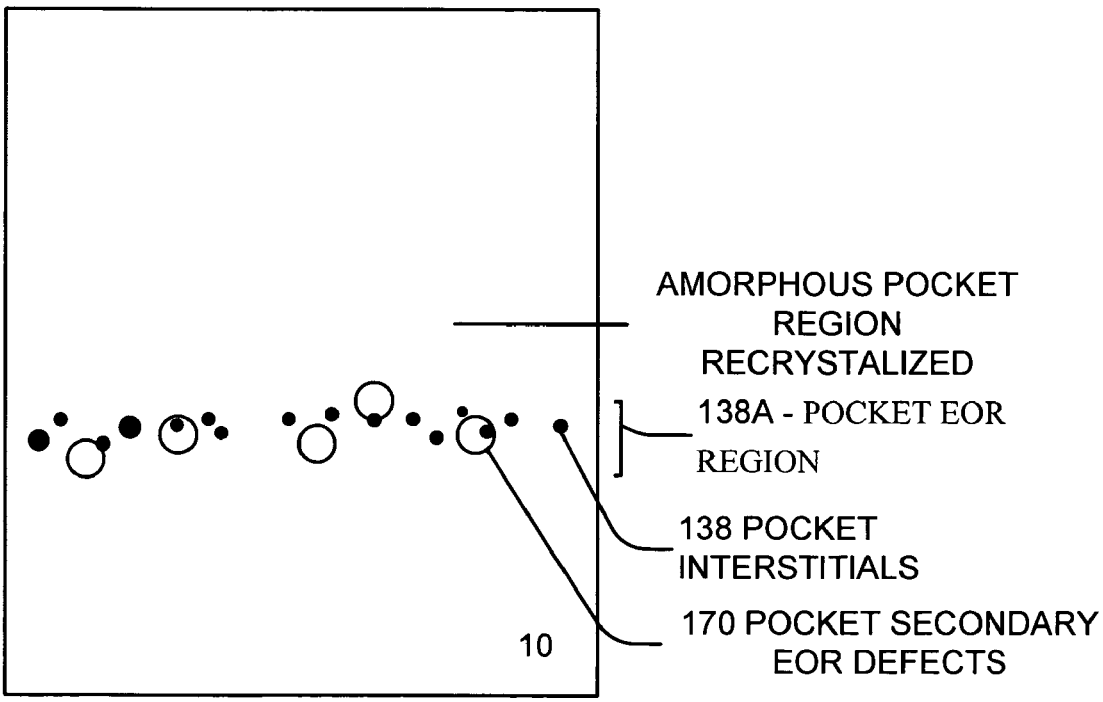
FIGURE 7B - POST SOAK ANNEAL

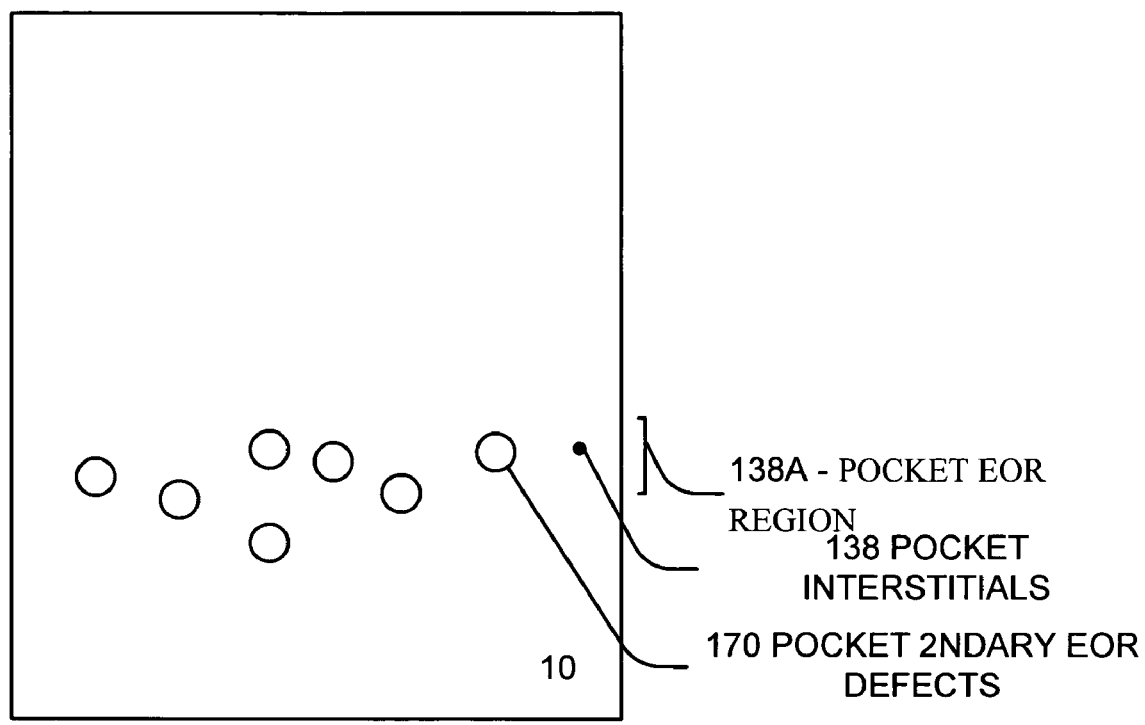
FIGURE 7C- POST SPIKE ANNEAL

IONS BEING IMPLANTED

Si SUBSTRATE

VACANCY RICH REGION

PROJECTED RANGE REGION

EOR REGION

SHALLOW AMORPHIZING IMPLANT FOR GETTERING OF DEEP SECONDARY END OF RANGE DEFECTS

BACKGROUND OF INVENTION

1) Field of the Invention

This invention relates generally to fabrication of semiconductor devices and more particularly to implant processes and more particularly to the fabrication of a pocket or Halo regions.

2) Description of the Prior Art

The semiconductor industry continuously strives to reduce the minimum feature sizes of MOSFETs in integrated circuits. These attempts are essentially driven by the need to produce ICs at lower costs, while retaining or improving circuit functionality and speed. This downscaling can for instance be achieved by reducing the characteristic dimensions of the transistors present on these ICs, and especially the gate lengths, the gate oxide thickness and the junction depths, and by increasing the channel doping levels.

Short MOS transistors generally suffer from the so-called short-channel effect (SCE): the source and drain regions will approach each other when the gate length is reduced. This has an adverse effect on the switching of the transistors in the sense that the switching is less controlled by the gate electrode, which leads to an undesired decrease in the threshold voltage. This adverse effect can be explained by a mechanism which causes the depletion regions around the source and the drain to occupy an increasingly large fraction of the channel region, so that a lower potential on the gate is needed to achieve inversion in the channel.

In the conventional MOSFET scaling scenarios, SCE has been kept within acceptable limits by reducing the junction depths and increasing the channel dopant concentration. These conventional scenarios, however, no longer work for sub-0.18 micron devices, because in these devices the suppression of SCE requires too high a doping level in the channel, which gives rise to junction breakdown.

A proposed solution to this problem is the use of pocket or halo counterdoping implants. Phosphorus, arsenic or antimony ions are used for pockets in PMOS transistors, while boron or indium ions are used for pockets in NMOS transistors. The pocket implants serve to raise the channel doping level in the immediate vicinity of the S/D regions. This leads to a net increase in the channel doping regions when the gate length is reduced, thereby suppressing the influence of the S/D depletion regions for short-channel devices.

In standard MOS processing, and especially in conventional Complementary MOS processing, the pocket implantation step, which is also referred to as the halo implantation step, is combined with the S/D (extension) implantation step. During this combined implantation step, certain areas of the silicon wafers are covered with a patterned resist layer in order to avoid undesired implantation of these areas. For instance, PMOS transistors are covered during formation of NMOS transistors and vice versa. These pocket implants and S/D implants are activated in a single annealing step after removal of the the resist layer. The dopant diffusion during this annealing step determines the distribution of both the pocket dopants and the S/D dopants.

FIG. 8A shows a diagram of ions being implanted into a silicon wafer according to the prior art.

FIG. 8B shows a cross sectional view of the wafer after the ion implant showing three regions: vacancy rich region, projected range region and End of range (EOR) region.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Ser. No. 2003/0013260A1(Gossmann et al.) shows a method of implanting vacancy-generating ions into a preselected region of the body.

U.S. Ser. No. 2003/0096490 A1—Borland, et al.—shows a method for forming a shallow junction in a semiconductor wafer.

U.S. Ser. No. 2002/0001926 A1—Noda—shows a process for an Ir pocket implant.

U.S. Pat. No. 6,537,886b2(Lee) and U.S. 2001/0041432A1 Lee show implant processes.

U.S. Ser. No. 2003/0049917 A1(Noda) shows a multiple I/I and anneal process.

U.S. Pat. No. 6,475,885B1(Sultan) shows a S/D formation with a sub-amorphizing I/I.

SUMMARY OF THE INVENTION

It is an object of aspects of the present invention to provide a method for reducing defects in semiconductor devices.

It is an object of aspects of the present invention to provide a method for reducing defects in a pocket implantation process in a semiconductor devices.

Aspects of the present invention provides a method which is characterized as follows. A method for forming an amorphous shallow implant region that getters defects from a pocket implantation; comprising:

a) providing a gate structure, on a substrate comprised with a first conductivity type dopant; the substrate comprised of an upper crystalline section;

b) performing a pocket amorphizing implantation procedure to implant ions of a second conductivity type to form a pocket implant region adjacent to the gate structure, and an amorphous pocket region; the amorphous pocket region is formed at a first depth below the substrate surface;

c) performing a shallow amorphizing implant to form an amorphous shallow implant region; the amorphous shallow implant region being formed at a second depth above the amorphous pocket region;

d) performing a SDE implant to form Source-Drain Extension regions of a second conductivity type using the gate structure as a mask;

e) performing a source/drain implant procedure to form deep source/drain regions;

f) performing an anneal procedure to recrystalize the amorphous shallow implant region and the amorphous pocket region, whereby the amorphous shallow implant region reduces defects formed by the pocket amorphizing implant.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 7A shows a cross sectional view of substrate 10 after a pocket implant that forms a amorphous pocket region 134 and pocket interstitials 138 in a pocket EOR region 138A.

FIG. 7B shows a cross sectional view of the substrate 10 after a soak anneal step.

FIG. 7C shows a cross sectional view of the substrate 10 after a spike anneal step.

DETAILED DESCRIPTION OF THE PREFERRED EMBODIMENTS

Figure 1:
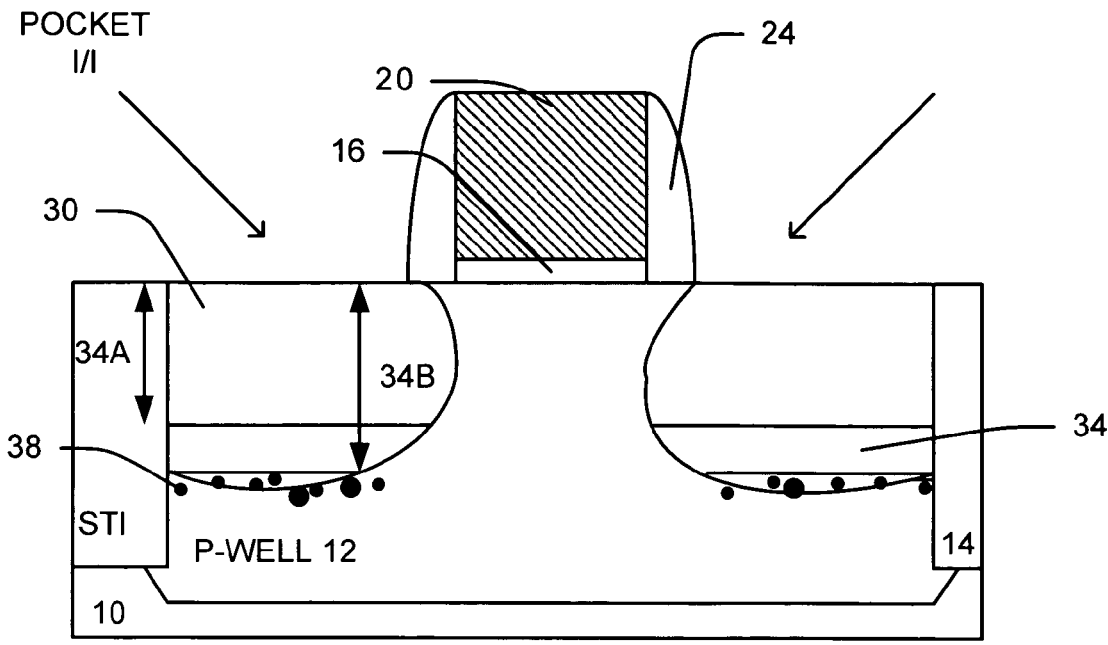
FIGS. 1, 2, 3A and 3B are cross sectional views showing a process to form a shallow amorphous region that getters defects according to an embodiment of the invention.

A. A Problem Alleviated by an Example Embodiment of the Invention

Referring now to the drawing and more particularly to FIGS. 7A, 7B and 7C there is shown pocket implant process over which embodiments of the present invention are an improvement. It is to be understood in this regard that no portion of FIGS. 7A, 7B and 7C is admitted to be prior art as the present invention. Rather, this highly simplified diagram is an effort to provide an improved understanding of some of the problems that are overcome by some of the example embodiments of the invention. The embodiments alleviated additional problems and the invention is not limited to by this problem solution.

FIG. 7A shows a cross sectional view of substrate 10 after a pocket implant that forms an amorphous pocket region 134 and pocket interstitials 138 in a pocket end of range (EOR) region 138A.

FIG. 7B shows a cross sectional view of the substrate 10 after a soak anneal step. The amorphous pocket region 134 is recrystalized. Pocket secondary EOR defects (e.g. faults or loops) 170 are formed.

FIG. 7C shows a cross sectional view of the substrate 10 after a spike anneal step. The pocket secondary EOR defects (e.g. faults or loops) 170 remain and can cause problems.

EXAMPLE EMBODIMENT FOR A POCKET IMPLANT

The example embodiments of the present invention will be described in detail with reference to the accompanying drawings. An embodiment of the present invention provides a method of forming a pocket implant region. The example illustrates a NMOS device, but both NMOS and PMOS devices may be fabricated.

A. Overview of Process Flow

The process shown in FIGS. 1, 2, 3A, and 3B preferably has the following steps.
STI formation
gate formation
Large angle tilted angle pocket Implant
Shallow amorphizing implant—key step
ultra shallow SDE implant
spacer formation
deep S/D implant
2 step anneal—Soak then spike B. Gate Structure 16 20 24 on a Semiconductor Substrate In an example embodiment, referring to FIG. 1, we provide a gate structure 16 20 24 on a substrate doped with a first conductivity type dopant.

The term "substrate" can refer generally to a wafer or die such as a silicon wafer. The substrate can be a wafer and may include one or more additional layers, such as epitaxial layers and the like, formed on the wafer. The substrate can be other semiconductor substrates, such as a silicon on insulator (SOI) substrate. The substrate can comprise other structure formed therein, such as isolation regions 14, such as shallow trench isolation (STI) regions.

The substrate is preferably a {001} silicon wafer doped with p-type impurities.

The substrate may include P and N wells, such as p-well 12.

The gate structure can comprise a gate dielectric 16 and a gate electrode and spacers 24.

C. Pocket Amorphizing Implantation Procedure

Figure 4A:
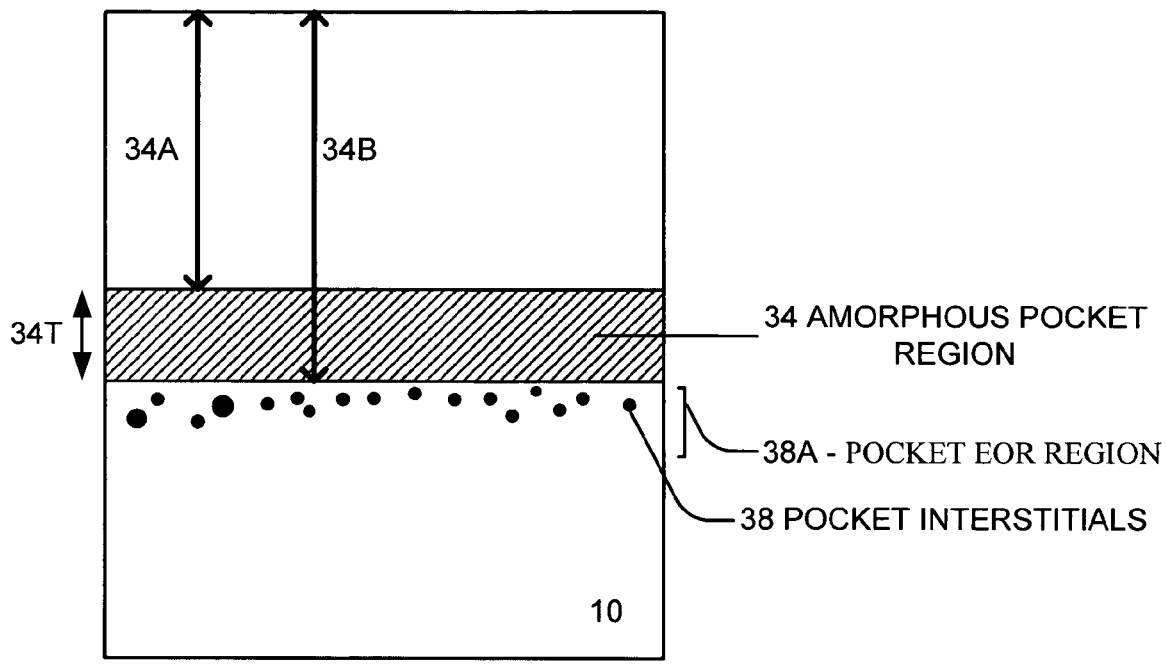
FIGS. 4A, 4B, 4C, 4D, and 4E are close up cross sectional views showing a process to form a shallow amorphous region that getters defects according to an embodiment of the invention.

Referring to FIG. 1 and FIG. 4A, we perform a pocket amorphizing implantation procedure to form a pocket implant region 30 of a first impurity type, an amorphous pocket region 34 and pocket interstitials 38 under the amorphous pocket region 34. The pocket implant region has the opposite impurity type doping as the subsequently formed source/drain (S/D) regions.

The amorphous pocket region 34 is preferably formed at a depth between 40 (34A) and 100 (34B) nm and more preferably between 40 (34A) and 60 (34B) nm. The amorphous pocket region 34 preferably has a thickness between 50 and 60 nm and more preferably between 10 and 20 nm. The substrate above the amorphous pocket region 34 preferably remains crystalline.

The pocket amorphizing implantation preferably comprises implanting a dopant species, such as Sb, Indium (p-type) or As Species at an energy between 115–150 keV and at a dose between 1E13 and 7E14 cm$^{-2}$ using a quad twist implant at a about 45 degree tilt angle to form a pocket implant to a maximum depth 34B between 40 and 65 nm.

The pocket amorphizing implant process implants species at a dose above the amortization threshold of the silicon substrate. The pocket amorphizing implant creates the pocket interstitials 38 that are the problem that the subsequent shallow amorphizing implant and two step soak/spike anneal solve.

D. Shallow Amorphizing Implant

Figure 2:
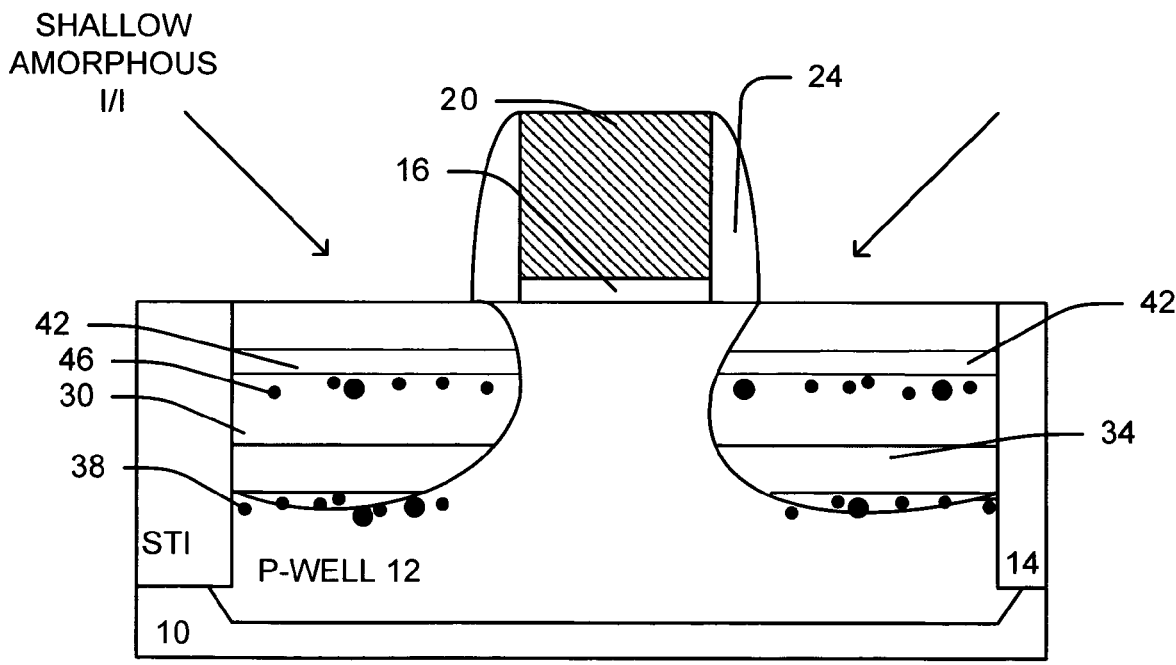
Figure 4B:
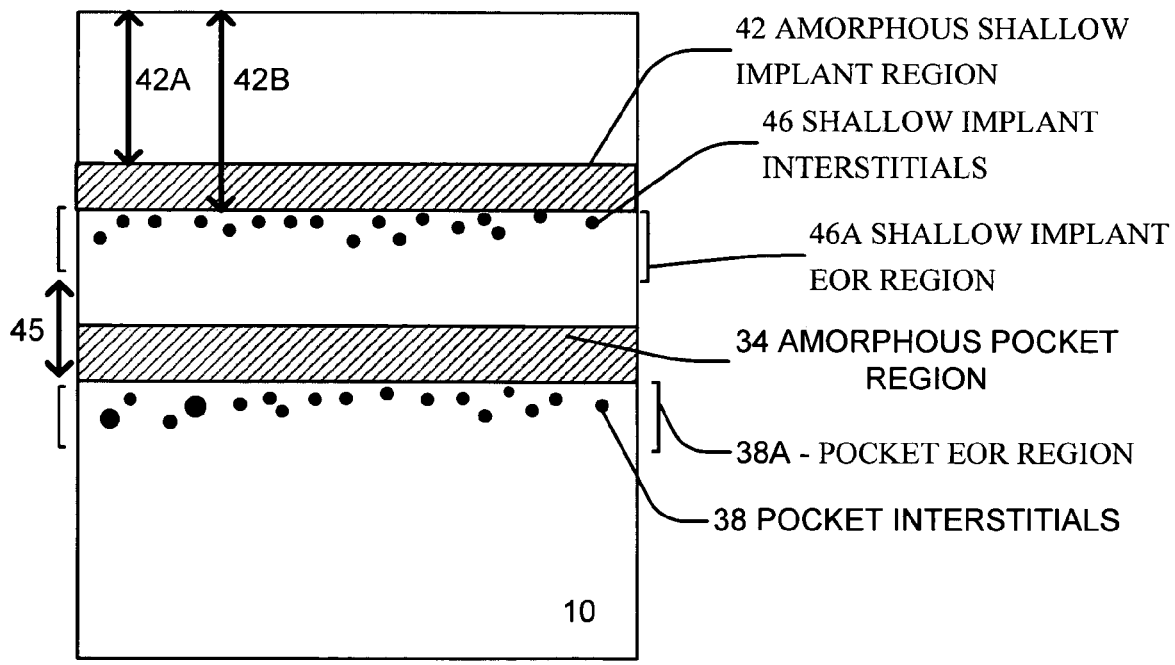

Referring to FIG. 2 and FIG. 4B, we perform a shallow amorphizing implant to form an amorphous shallow implant region 42 and shallow implant interstitials 46.

The amorphous shallow implant region 42 is formed at a second depth above the amorphous pocket region 34. The substrate above the amorphous shallow implant region 42 preferably remains crystalline. The amorphous shallow implant region 42 is preferably formed at a depth below the subsequently formed SDE region (See FIG. 2-# 64).

The shallow amorphizing implant preferably comprises: implanting As, Si, or Ge species at a dose greater than 5E13 cm$^{-2}$ and more preferably at a dose between 5E13 cm$^{-2}$ and 7E14 cm$^{-2}$ and at an energy between 5 and 10 keV, and preferably at a 7°angle and a quad twist. Minor adjustments for the implant energies may be need for the different species.

The amorphous shallow implant region 42 is preferably formed at a minimum depth (42A) of about 8 nm and a maximum depth (42B) of 20 nm below the substrate surface.

The amorphous shallow implant region 42 has a thickness between 5 and 10 nm.

In this technology, the distance 45 between the bottom of the shallow implant EOR region 46A and the top of the Pocket EOR region 38A is preferably between 60 and 80 nm. The amorphous shallow region 42 is not a conventional Pre-Amorphous Implant (PAI) region. The depth and width of the amorphous region is adjusted (e.g., implant dose and energy) for each technology to improve the gettering of deep secondary pocket defects.

The shallow implant EOR region 46A preferably has a thickness between 200 and 300 Å.

E. SDE Regions 64

Figure 3A:
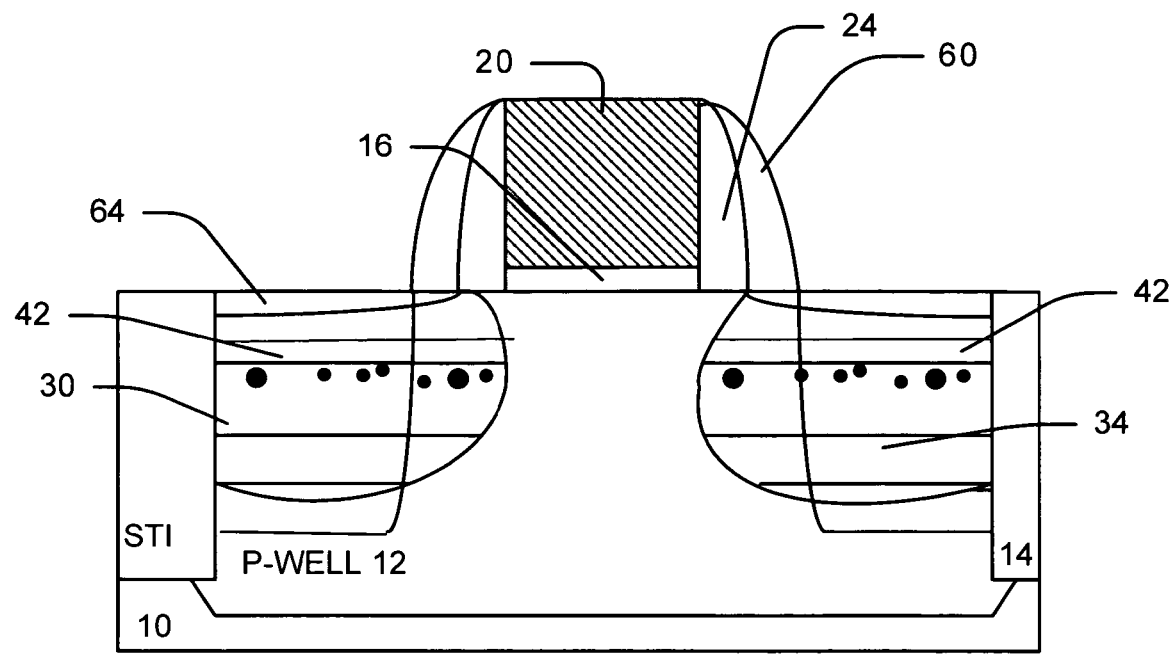
Figure 3B:
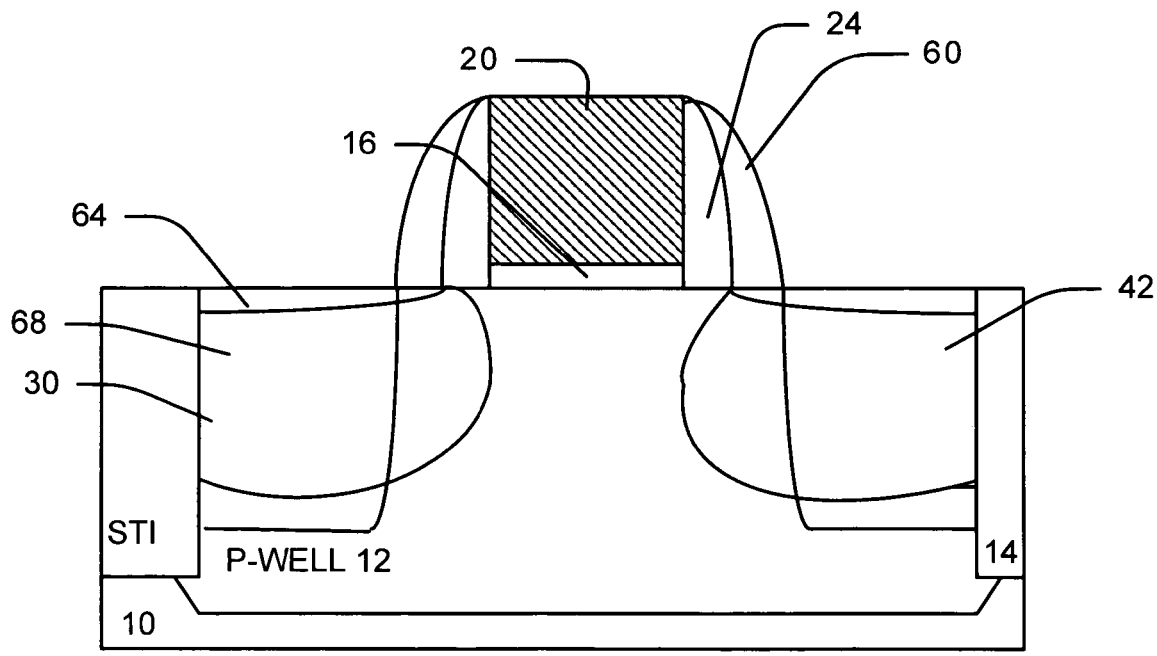

Referring to FIG. 3A, we perform a source-drain-extension (SDE) (or LDD) implant using the gate structure as a mask to form SDE regions 64 of a second conductivity type, in an area of the semiconductor substrate not covered by the gate structure. The SDE regions preferably located in a top portion of the pocket region; Before the SDE implant, an optional Pre-Amorphous Implant (PAI) can be performed.

The SDE regions 64 are preferably formed to a maximum depth of between 20 and 40 nm. The embodiment's shallow amorphous region 42 preferably does not enclose the SDE regions.

Preferably the SDE regions are annealed by the subsequent 2 step anneal described below. There is preferably no separate anneal for the SDE regions.

F. Forming Spacers 60

Referring to FIG. 3, we form second spacers 60 on the sidewalls of the gate structure 16 20 24.

G. Deep S/D Regions 68

As shown in FIG. 3, we perform a source/drain (S/D) implant procedure to form Deep S/D regions 68. Before the S/D implant, an optional Pre-amorphous implant (PAI) can be performed.

H. Anneal Procedure

Referring to FIGS. 3A and 3B, and FIGS. 4C, 4D and 4E, we perform an anneal procedure preferably comprised of a first soak step and a second spike step to recrystalilze the amorphous shallow implant region 42 and the amorphous pocket region 34. This anneal reduces the shallow secondary EOR defects 70 adjacent the shallow implant interstitials 46 and deep secondary EOR defects 80 adjacent the pocket interstitials 38.

Figure 5:
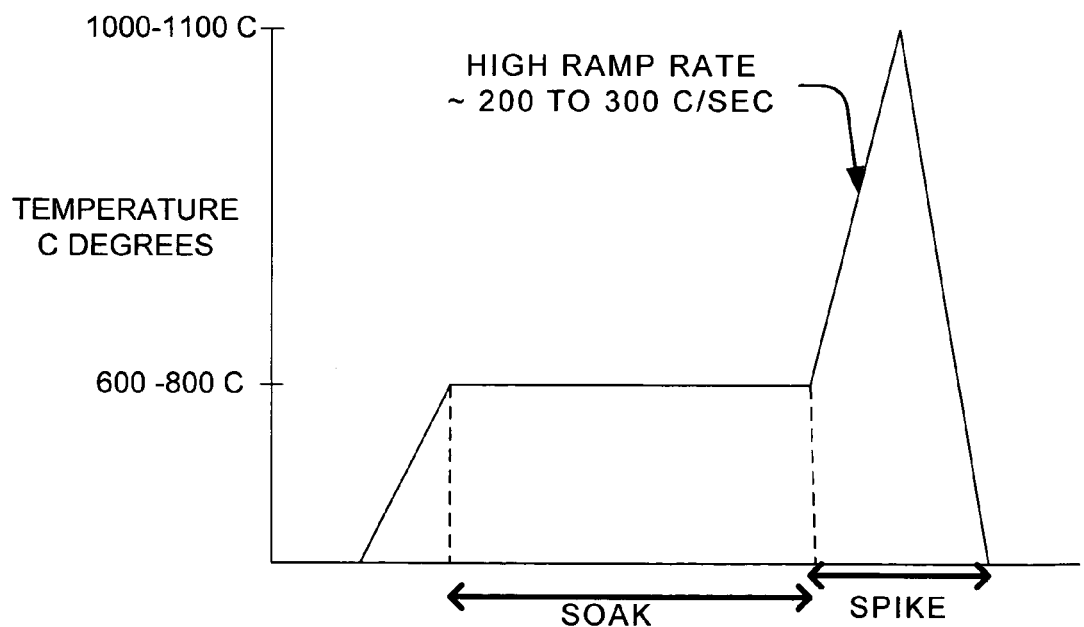
FIG. 5 shows an example diagram of an embodiment for the anneal.

FIG. 5 shows an example diagram of an embodiment for the anneal. The anneal is preferably a rapid thermal process (RTP) anneal.

The anneal procedure preferably comprises (1) a soak step at a temperature between 600 and 800° C. for a time between 10 and 30 seconds and (2) a spike step. In the spike step, the temperature ramps up to a peak temperature between 1000 and 1100° C. and a ramp down from the peak temperature to a temperature below 800° C. The ramp up and ramp down have a rate between 200 and 300 degree C. per minute.

The embodiments' rapid thermal process (RTP) anneal differs from a conventional furnace anneal because furnace anneals typical are performed for more than 30 minutes. In contrast, a RTP involves heating only the surface of the wafer for usually less than 30 seconds.

The two step anneal is rather important in this embodiment. The intention of the shallow amorphizing implant, 42, is to intentionally introduce a layer of shallow silicon interstitial saturated region, 46, via implantation. During the soak step of the anneal, the amorphous regions are being annealed out (34 and 42) where they re-crystalize. Simultaneously, at regions 38 and 46, the interstitials clusters, forming dislocations. As the interstitial (38) concentration in Deep EOR region 38A is made much higher, the formation of the deep secondary EOR defects (dislocations) 80 is made easier. These deep secondary EOR defects (dislocations) 80 serves as sinks, for the pocket interstitials 38 at region 38A, suppressing the defect formation in the region 38A.

Upon spike stage of the anneal, removal of the dislocation loop in region 38 is facilitated as majority of the dislocation are now displaced towards the surface of the silicon.

I. Pocket or Halo Implant

FIG. 4A shows a cross section view of a substrate 10 that has Si Interstitials 38 formed underneath and adjacent to the amorphized pocket region 34. The Si Interstitials 38 and amorphized pocket region 34 are formed by the pocket or Halo implant shown in FIG. 1. The pocket implant causes the amorphized pocket region and the Si interstitials because the damaging effect of the implantation. The pocket or halo implant causes severe end of range damage (EOR) damage such as the Si Interstiatial saturated region.

J. Shallow Amorphizing Implant

FIG. 4B shows a cross section view of a substrate 10 after the embodiment's shallow amorphizing implant procedure to form an amorphous shallow implant region 42 and shallow implant interstitials 46 in a shallow interstitial saturated region 46A. The amorphous shallow implant region 42 being formed at a second depth above the amorphous pocket region 34. The substrate above the amorphous shallow implant region 42 preferably remains crystalline.

K. Soak Anneal Step

Figure 4C:
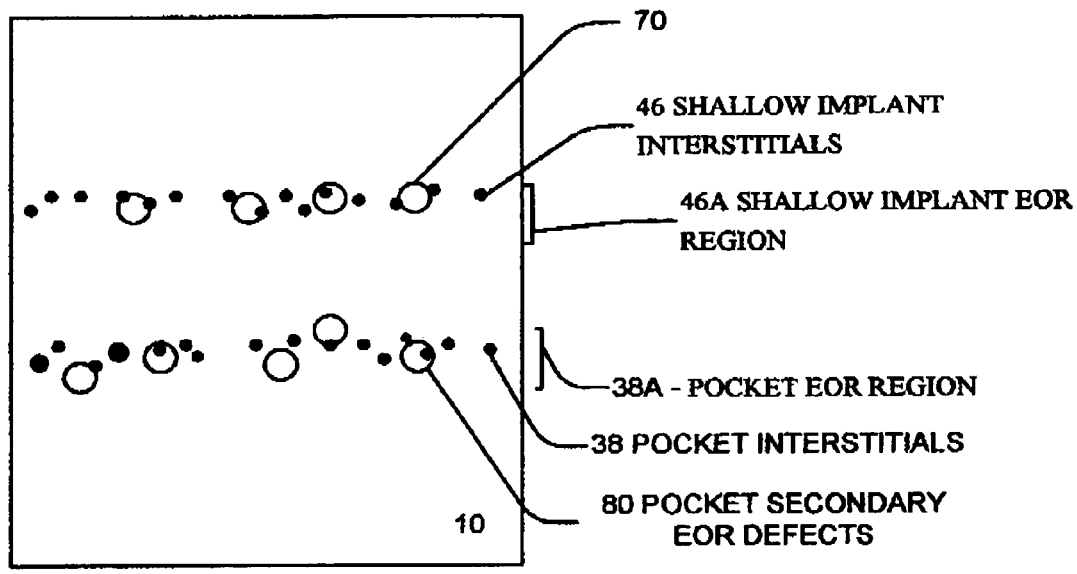

FIG. 4C shows a cross section view of a substrate 10 that has completed the first soak step of the embodiment's anneal. As shown in FIG. 4C, the amorphous shallow implant region 42 and the amorphous pocket region 34 are recrystalilzed.

As illustrated in FIG. 4C, deep secondary EOR defects 80 (represented by the circles) are formed in a deep secondary EOR defect region 80A and shallow secondary EOR defects 70 are formed in the shallow secondary EOR defect region 70A. The EOR defects can be dislocation loops or dislocation planes.

During the soak step of the anneal, the amorphous regions are being annealed out (34 and 42) where they re-crystallize. Simultaneously, at regions 38 and 46, the interstitials clusters, forming dislocations. As the interstitial (38) concentration in Deep EOR region 38A is made much higher, the formation of the deep secondary EOR defects (dislocations) 80 is made easier. During the soak step, these deep secondary EOR defects (dislocations) 80 serves as sinks, for the pocket interstitials 38 at region 38A, suppressing the defect formation in the region 38A.

L. Theorized Mechanism for Defect Removal

The pocket interstitials 38 clusters form deep (pocket) Secondary EOR defects 80.

The shallow implant interstitials 46 form shallow secondary EOR defect (dislocations) 70.

Figure 4D:
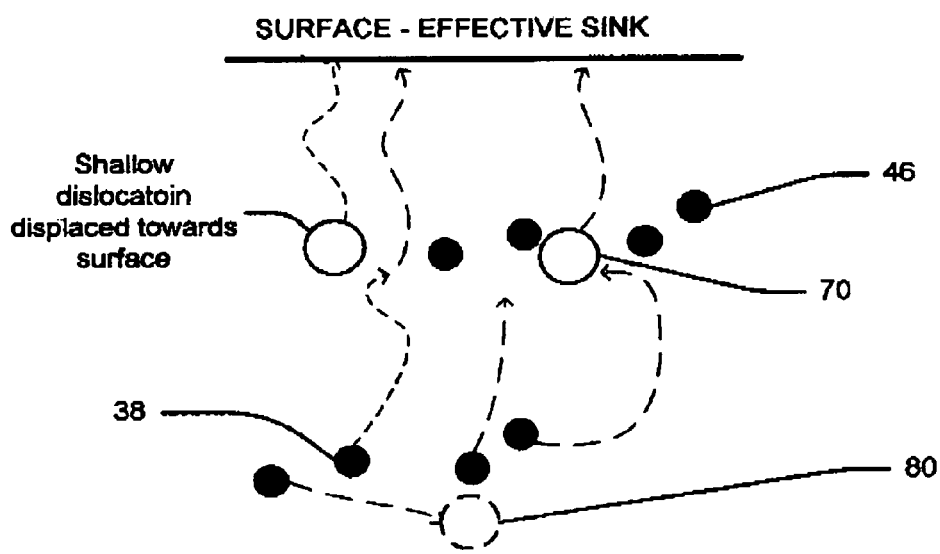

FIG. 4D shows the proposed mechanism that the embodiments reduce deep secondary EOR defects 70.

As shown in FIG. 4D, a proposed mechanism is that during the soak step of the anneal:

The pocket interstitials 38 contribute to the formation of deep secondary dislocations 80 that move up to the shallow implant EOR region 46A.

The deep (pocket) Secondary EOR defects 80 move up to the shallow implant interstitials region 46A and contribute to the shallow EOR defects 70.

The shallow EOR defects 70 move up to the substrate surface and are removed.

The deep (pocket) Secondary EOR defects 80 and the shallow EOR defects 70 are easily removed as they are located near substrate surface as compared to the deeper secondary EOR defects 80.

The shallow implant interstitials 46 move up to the surface and are removed.

The end result is that the deep secondary EOR defects 80 and pocket interstitials 38 are reduced.

M. Spike Anneal Step

Figure 4E:
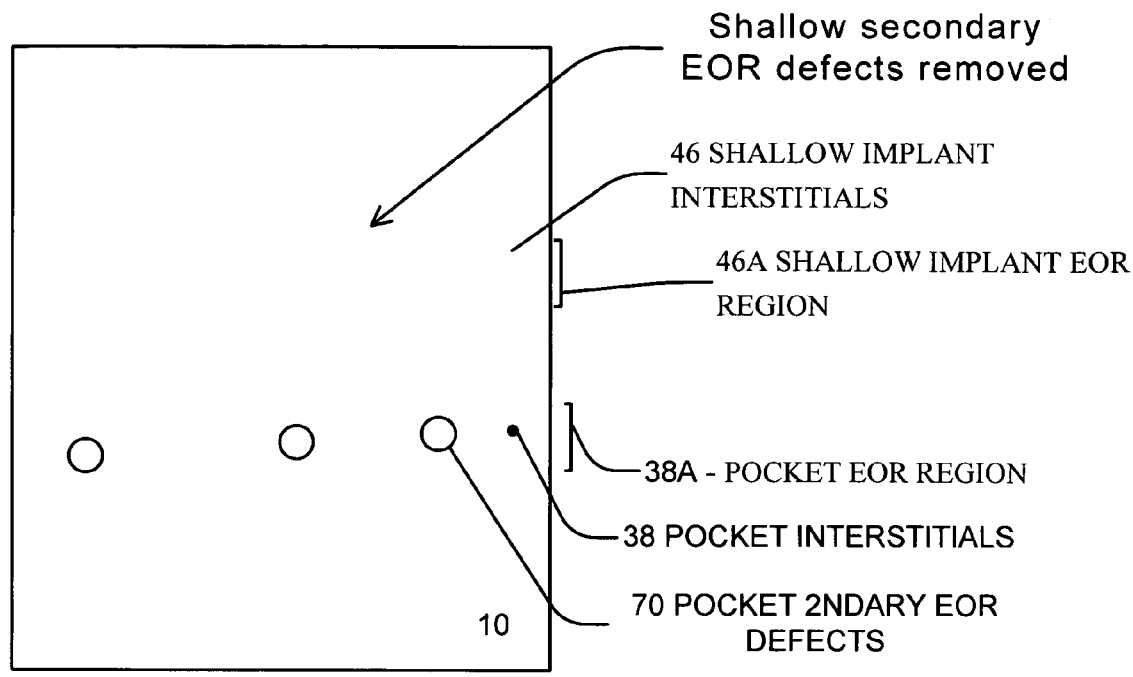

As shown in FIG. 4E, during spike stage of the anneal, additional EOR defects 70 80 migrate towards the substrate surface and are removed. Also, the amorphous regions are completely re-crystallized. Also, dopants are activated where the dopant ions become interstitial.

EXAMPLES

Figure 6A:
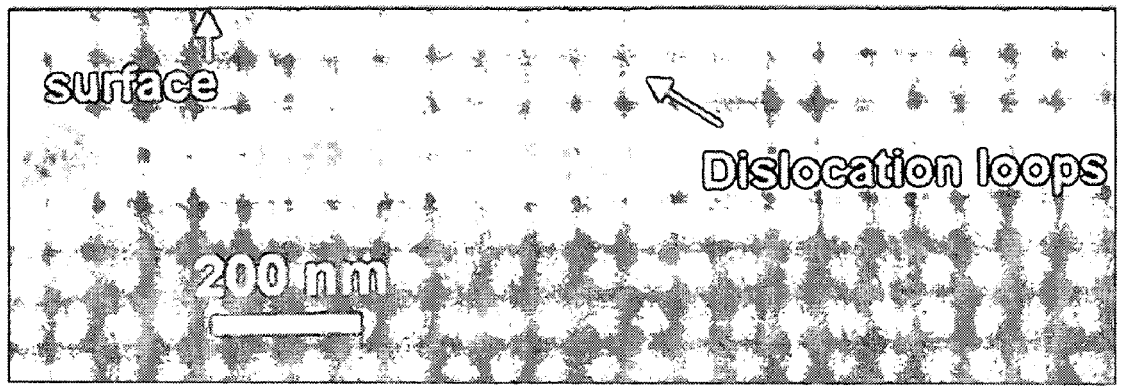
FIG. 6A is a TEM image of a wafer that has a pocket (amorphizing) implant and the 2 step soak anneal according to a process known to the inventors.
Figure 6B:
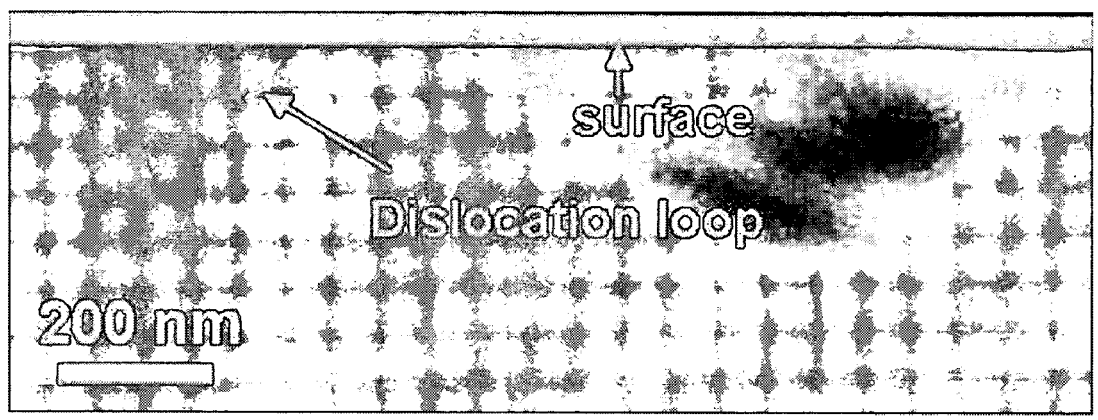
FIG. 6B is a TEM image of a wafer that has an pocket (amorphizing) implant, the embodiment's shallow amorphizing implant and the embodiments' 2 step soak anneal.
Figure 8A:
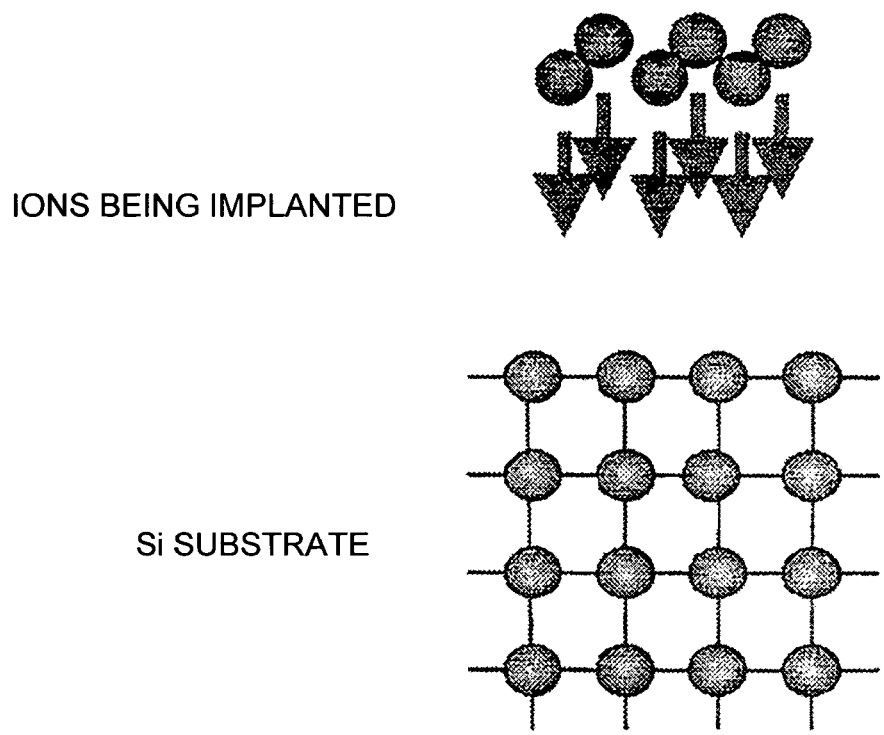
FIG. 8A shows a diagram of ions being implanted into a silicon wafer according to the prior art.
Figure 8B:
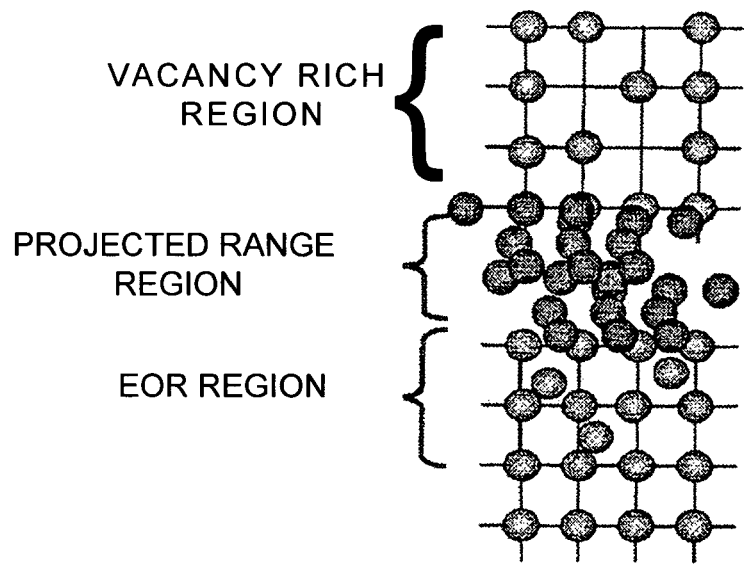
FIG. 8B shows a cross sectional view of the wafer after the ion implant according to the prior art showing three regions: vacancy rich region, projected range region and end of range (EOR) region.

FIGS. 6A and 6B are cross sectional TEM Images of wafers. FIG. 6A is a TEM image of a wafer that has a pocket (amorphizing) implant and the two step soak anneal. The wafer in FIG. 6A has not had the embodiment's shallow amorphizing implant. FIG. 6A shows a high density of dislocation loops (e.g., deep pocket secondary EOR defects (like 80 in FIG. 4E)).

FIG. 6B is a TEM image of a wafer that has an pocket (amorphizing) implant, the embodiment's shallow amorphizing implant and the embodiments' 2 step soak anneal. FIG. 6B shows a low density of dislocation loops (e.g., deep pocket secondary EOR defects (like 80 in FIG. 4E)).

A comparison of FIG. 6A with FIG. 6B shows that the embodiments' shallow amorphizing implant and 2 step anneal significantly reduces the (e.g., deep pocket secondary EOR defects (like 80 in FIG. 4E)).

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming an amorphous shallow implant region that getters defects from a pocket implantation; comprising:
   a) providing a gate structure, on a substrate comprised with a first conductivity type dopant; said substrate comprised of an upper crystalline section;
   b) performing a pocket amorphizing implantation procedure to implant ions of a first conductivity type to form a pocket implant region adjacent to said gate structure, and an amorphous pocket region;
      (1) said amorphous pocket region is formed at a first depth below the substrate surface;
   c) performing a shallow amorphizing implant to form an amorphous shallow implant region;
      (1) said amorphous shallow implant region being formed at a second depth above said amorphous pocket region;
   d) performing an anneal procedure to recrystalize the amorphous shallow implant region and said amorphous pocket region, whereby said amorphous shallow implant region reduces defects formed by the pocket amorphizing implant.

2. The method of claim 1 wherein the anneal procedure is comprised of a first soak step and a second spike step.

3. The method of claim 1 wherein said amorphous pocket region is formed at a depth between 40 and 100 nm; said amorphous pocket region has a thickness between 10 and 20nm; and the substrate above the amorphous pocket region remains crystalline.

4. The method of claim 1 wherein the pocket amorphizing implantation comprises implanting Sb or In species at an energy between 115 and 150 keV using a quad implant at a 45 degree angle to form a pocket implant to a depth between 40 and 100 nm.

5. The method of claim 1 wherein the shallow amorphizing implant comprises: implanting As, Si or Ge species at a dose between $5E13 cm^{-2}$ and $7E14 cm^{-2}$ and at an energy between 5 and 10 keV, and at a 7 degree and a quad twist; said first conductivity type is N-type and said second conductivity type is p-type.

6. The method of claim 1 wherein said amorphous shallow implant region is formed at a minimum depth of about 8 nm and a maximum depth of 20 nm below the substrate surface; said amorphous shallow implant region has a thickness between 5 and 10 nm.

7. The method of claim 1 wherein the anneal procedure comprises: (1) a soak step at a temperature between 600 and 800° C. for a time between 10 and 30 seconds and (2) a spike step where the temperature ramps up to a peak temperature between 1000 and 1100° C. and a ramp down from said peak temperature to a temperature below 800° C.; said ramp up end ramp down have a rate between 200 and 300 degree °C. per minute.

8. The method of claim 1 wherein said amorphous shallow implant region is not a halo region.

9. The method of claim 1 wherein said wherein the shallow amorphizing implant comprises: implanting As, Si, or Ge species; said first conductivity type is p-type and said second conductivity type is n-type.

10. The method of claim 1 wherein said wherein the shallow amorphizing implant comprises: implanting Si, or Ge species.

11. A method for forming an amorphous shallow implant region that getters defects from a pocket implantation; comprising:
   a) providing a gate structure, on a substrate comprised with a first conductivity type dopant said substrate comprised of an upper crystalline section;
   b) performing a pocket amorphizing implantation procedure to implant ions of a first conductivity type to form a pocket implant region adjacent to said gate structure and an amorphous pocket region;
      (1) said amorphous pocket region is formed at a first depth below the substrate surface;
   c) performing a shallow amorphizing implant to form an amorphous shallow implant region; the shallow amorphizing implant comprises: implanting ions of Si, As, or Ge species;
      (1) said amorphous shallow implant region being formed at a second depth above said amorphous pocket region;
   d) performing a SDF, implant to form SDE regions of a second conductivity type using said gate structure as a mask;
   e) performing a source/drain implant procedure to form deep source/drain regions;
   f) performing an anneal procedure to recrystalize the amorphous shallow implant region and said amorphous pocket region, whereby said amorphous shallow implant region reduces defects formed by the pocket amorphizing implant.

12. The method of claim 11 wherein the anneal procedure is comprised of a first soak step and a second spike step.

13. The method of claim 11 wherein said amorphous pocket region is formed at a depth between 40 and 100 nm; said amorphous pocket region has a thickness between 10 and 20 nm;
and the substrate above the amorphous pocket region remains crystalline.

14. The method of claim 11 wherein the pocket amorphizing implantation comprises implanting Sb or In species at an energy between 115 and 150 keV using a quad implant at a 45 degree angle to form a pocket implant to a depth between 40 and 100 nm.

15. The method of claim 11 wherein the shallow amorphizing implant comprises: implanting As, Si, or Ge species at a dose between 5E13cm$^{-2}$ and 7E14 cm$^{-2}$ and at an energy between 5 and 10 keV, and at a 7 degree and a quad twist.

16. The method of claim 11 wherein said amorphous shallow implant region is formed at a minimum depth of about 8 nm and a maximum depth of 20 nm below the substrate surface; said amorphous shallow implant region has a thickness between 5 and 10 nm.

17. The method of claim 11 wherein said amorphous shallow implant region has a thickness between 5 and 10 mm.

18. The method of claim 11 wherein the S/D implant procedure comprises: implanting As ions at a dose of between 5E13 and 7E14 atoms/sq-cm; an energy between 5 and 10 keV and a maximum depth between 30 and 50 nm.

19. The method of claim 11 wherein the anneal procedure comprises: (1) a soak step at a temperature between 600 and 800° C. for a time between 10 and 30 seconds and (2) a spike step where the temperature ramps up to a peak temperature between 1000 and 1100° C. and a ramp down from said peak temperature to a temperature below 800° C.; said ramp up and ramp down have a rate between 200 and 300 degree ° C. per minute.

20. A method of for a pocket implant comprising:
   a) providing a gate structure on a semiconductor substrate comprised with a first conductivity type dopant;
   b) performing a pocket amorphizing implantation procedure to implant ions of a first conductivity type to form a pocket implant region adjacent to said gate structure, an amorphous pocket region and pocket interstitials under the amorphous pocket region;
   c) performing a shallow amorphizing implant to form an amorphous shallow implant region and shallow implant interstitials; the amorphous shallow implant region being formed at a second depth above said amorphous pocket region;
   the substrate above the amorphous shallow implant region remains crystalline;
      (1) said amorphous shallow implant region is formed at a minimum depth of about 8 nm and a maximum depth of 20 nm below the substrate surface; said amorphous shallow implant region has a thickness between 5 and 10 nm;
   d) performing a SDE implant to form SDE regions of a second conductivity type, in an area of said semiconductor substrate not covered by said gate structure, with said SDE regions located in a top portion of said pocket region;
   e) forming spacers on the sidewalls of the gate structure;
   f) performing a S/D implant procedure to form Deep S/D regions;
   g) performing an anneal procedure comprised of a first soak step and a second spike step to recrystalilze the amorphous shallow implant region and said amorphous pocket region; whereby said shallow amorphous implant region reduces the defects from the pocket implantation.

21. The method of claim 20 wherein the pocket amorphizing implantation comprises implanting Sb or In species at an Energy between 115–150 keV using a quad implant at a 45 degree angle to form a pocket implant region to a depth between 40 and 100 nm.

22. The method of claim 20 wherein said amorphous pocket region is formed at a depth range between 40 and 100 nm; said amorphous pocket region has a thickness between 10 and 20 nm; the substrate above the amorphous pocket region remains crystalline.

23. The method of claim 20 wherein the shallow amorphizing implant comprises: implanting As, Si, or Ge species at a dose greater than 5E13cm$^{-2}$ and at an energy between 5 and 10 keV, and at a 7 degree and a quad twist.

24. The method of claim 20 wherein said wherein the shallow amorphizing implant comprises: implanting Si, Ge or As species.

* * * * *

UNITED STATES PATENT AND TRADEMARK OFFICE
CERTIFICATE OF CORRECTION

| | | |
|---|---|---|
| PATENT NO. | : 7,071,069 B2 | |
| APPLICATION NO. | : 10/743247 | |
| DATED | : July 4, 2006 | |
| INVENTOR(S) | : Chong Foong Tan et al. | |

It is certified that error appears in the above-identified patent and that said Letters Patent is hereby corrected as shown below:

* Claim 11, col. 9, line 36, step (d), "SDF ," changed to --SDE--.

* Please replace the entire Issued Claim 20, starting at col 10, lines 15 to 48 with the following:

--20. A method for a pocket implant comprising:
a) providing a gate structure on a semiconductor substrate comprised with a first conductivity type dopant;
b) performing a pocket amorphizing implantation procedure to implant ions of a first conductivity type to form a pocket implant region adjacent to said gate structure, an amorphous pocket region and pocket interstitials under the amorphous pocket region;
c) performing a shallow amorphizing implant to form an amorphous shallow implant region and shallow implant interstitials; the amorphous shallow implant region being formed at a second depth above said amorphous pocket region;
the substrate above the amorphous shallow implant region remains crystalline;
(1) said amorphous shallow implant region is formed at a minimum depth of about 8 nm and a maximum depth of 20 nm below the substrate surface; said amorphous shallow implant region has a thickness between 5 and 10 nm;

d) performing a SDE implant to form SDE regions of a second conductivity type, in an area of said semiconductor substrate not covered by said gate structure, with said SDE regions located in a top portion of said pocket region;
e) forming spacers on the sidewalls of the gate structure;
f) performing a S/D implant procedure to form Deep S/D regions;

UNITED STATES PATENT AND TRADEMARK OFFICE
CERTIFICATE OF CORRECTION

PATENT NO. : 7,071,069 B2
APPLICATION NO. : 10/743247
DATED : July 4, 2006
INVENTOR(S) : Chong Foong Tan et al.

It is certified that error appears in the above-identified patent and that said Letters Patent is hereby corrected as shown below:

\*   Please replace the entire Issued Claim 20, starting at col 10, lines 15 to 48 with the following: (cont'd)

g) performing an anneal procedure comprised of a first soak step and a second spike step to recrystalilze the amorphous shallow implant region and said amorphous pocket region; whereby said shallow amorphous implant region reduces the defects from the pocket implantation;

(1) the anneal procedure comprises (1) a soak step at a temperature between 600 and 800 °C for a time between 10 and 30 seconds and (2) a spike step where the temperature ramps up to a peak temperature between 1000 and 1100 °C and a ramp down from said peak temperature to a temperature below 800 °C; said ramp up and ramp down have a rate between 200 and 300 degree° C per minute. --

Signed and Sealed this

Fifteenth Day of May, 2007

JON W. DUDAS
*Director of the United States Patent and Trademark Office*